United States Patent [19]

Fukahori et al.

[11] Patent Number: 4,691,172

[45] Date of Patent: Sep. 1, 1987

[54] MOS SWITCHED CAPACITOR AUTOMATIC GAIN CONTROL CIRCUIT

[75] Inventors: Kiyoshi Fukahori; Thomas Glad, both of Grass Valley, Calif.

[73] Assignee: Silicon Systems, Inc., Tustin, Calif.

[21] Appl. No.: 774,544

[22] Filed: Sep. 10, 1985

[51] Int. Cl.⁴ .............................................. H03G 3/20
[52] U.S. Cl. .................................... 330/129; 330/138; 330/144; 330/279; 330/284
[58] Field of Search ................. 330/86, 127, 129, 138, 330/141, 279, 280, 281, 282, 283, 144, 145, 284

[56] References Cited

U.S. PATENT DOCUMENTS 3,944,942  3/1976  Chudleigh, Jr. ..................... 330/86
3,969,683  7/1976  Fabricius ......................... 330/129 X
4,441,082  4/1984  Haque .............................. 330/129

FOREIGN PATENT DOCUMENTS 58306  5/1981  Japan .................................... 330/282

Primary Examiner—James B. Mullins
Attorney, Agent, or Firm—Blakely, Sokoloff, Taylor & Zafman

[57] ABSTRACT

An apparatus for adjusting the amplitude of an electronic signal to a predetermined level in a MOS integrated circuit device. A variable amplifier comprising a plurality of operational amplifier stages whose gain is controlled by capacitor ratios is utilized to amplify an input signal. The output of the variable amplifier is coupled to a comparator comprising a single operational amplifier to compare the output with a reference signal level corresponding to the desired output level of the circuit. The comparator generates an instruction signal to a flip-flop circuit and an up/down counter to provide digital control to the amplifier gain stages. The digital bits of the counter, depending on whether high or low, selectively switch the appropriate capacitors into operation to vary the gain of each operational amplifier stage.

17 Claims, 5 Drawing Figures

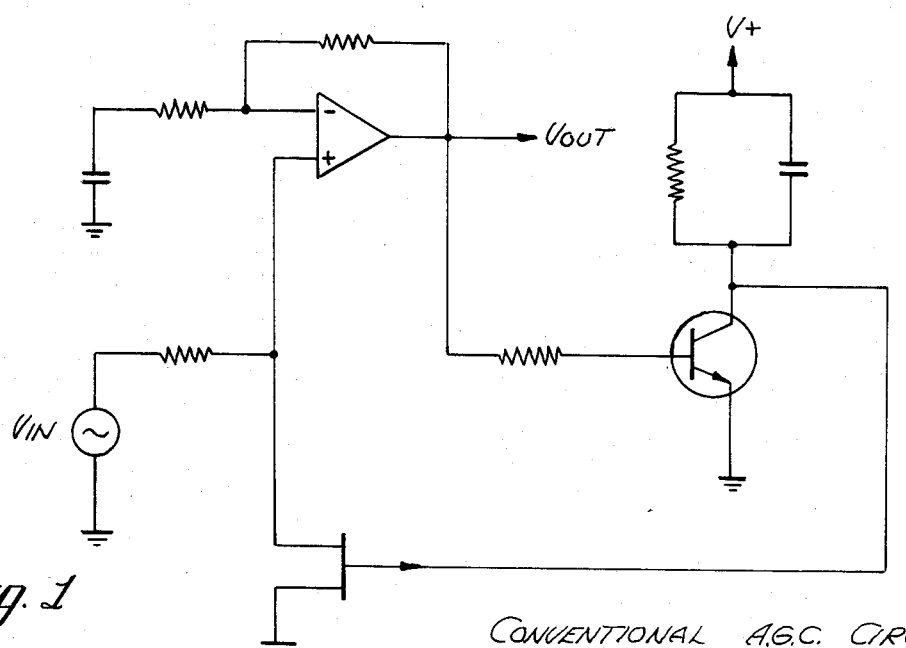
Fig. 1   CONVENTIONAL A.G.C. CIRCUIT
PRIOR ART
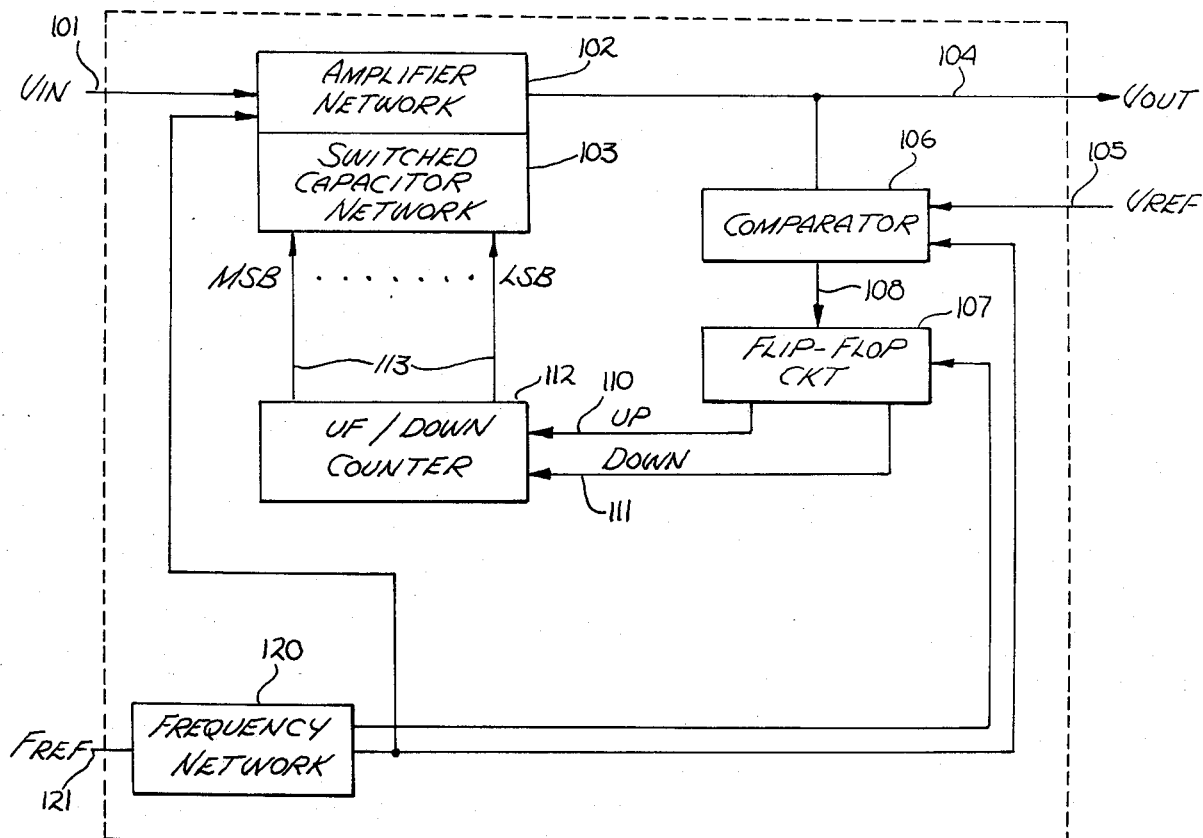
Fig. 2   BLOCK DIAGRAM
SWITCHED CAPACITOR
AGC CIRCUIT

MOS SWITCHED CAPACITOR AUTOMATIC GAIN CONTROL CIRCUIT

FIELD OF THE INVENTION

This invention relates to digitally controlled automatic gain control circuits using switch capacitor techniques to provide the required gain of amplifier stages.

BACKGROUND AND PRIOR ART

1. Prior Art

As U.S. Pat. No. 4,441,082 discloses a switched capacitor automatic gain control loop utilizing MOS technology and providing an AGC circuit integrated on a monolithic IC chip. U.S. Pat. No. 4,441,082 discloses a rectification circuit and converting analog signals to drive the counter.

2. Background

Automatic gain control (AGC) circuits are widely used in a variety of applications for maintaining a constant signal output levels for varying amplifier input signal levels. A typical electronic amplifier accepts an incoming electronic signal, such as an audio tone, amplifies that signal by a multiplying gain factor determined by the amplifier stage, and provides an output signal that is an amplified replication of the input signal.

It is an inherent characteristic of such an amplifier to respond linearly to the amplitude of the applied input signal. Because the amplifier stage maintains a fixed gain, both weak incoming signals and strong incoming signals are multiplied by the same gain factor such that the output of the amplifier stage responds correspondingly to the input signal. Weak (i.e., small amplitude) components of the input signal, although amplified, will form small amplitude components of the output signal. The overall result is that the amplifier output signal varies in amplitude in accordance with the amplitude variance of the input signal. As a result, in the particular example of a tone amplifier, the listener will experience a fading effect as the tone varies in loudness according to the amplitude of the signal.

An Automatic Gain Control ("AGC") system eliminates this fading effect by maintaining a constant level of amplitude at the output of the amplifier stage by varying amplifier stage gain. In an AGC circuit the gain of an amplifier stage varies inversely to the amplitude of the input signal level. This is accomplished by setting the output level of the amplifier initially to a predetermined reference level. The AGC circuitry seeks to maintain this reference level. When the amplitude of the input signal decreases below a predetermined threshold level, the AGC circuit senses the decrease in amplitude at the output of the amplifier. It thus increases the amplifier stage gain until the amplitude of the output signal increases to the reference level. If the amplitude of the input signal increases above the nominal level, the AGC circuit senses the increase in amplitude at the output of the amplifier stage, and decreases the amplifier stage gain until the amplitude of the output signal decreases to the reference level. The AGC circuit provides the necessary control signals that control the gain setting of amplifier stages.

FIG. 1 illustrates one of the most common embodiments of a prior art AGC circuit. The conventional AGC system such as that shown in FIG. 1, however, cannot be suitably adapted for use in a metal-oxide-semiconductor (MOS) implementation. This is due to the fact that a gain setting variable resistor is an inaccurate passive device in MOS technology. As a result, variable resistive dividers embodied in a MOS device is likely to cause high harmonic distortion when pressed for a large dynamic performance. The large time constants often needed for the attack and release times, (in the order of milliseconds), require passive components of large physical dimensions. This precludes their placement on a large scale integrated circuit (IC) chip.

Further, operational amplifiers realizable in MOS technology do not provide sufficiently high gain or low offset voltage for most desired applications. They also tend to possess non-linear distortion characteristics. The output amplitude is subject to process temperature variations and not well controlled. As a result, prior art implementations of AGC circuits are generally unsatisfactory for MOS technology without utilizing complex circuitry at considerable cost.

SUMMARY OF THE INVENTION

An apparatus for adjusting the amplitude of an electronic signal to a predetermined level in a MOS integrated circuit device is disclosed. The invention includes a plurality of operational amplifiers wherein each amplifier stage is cascaded to a subsequent stage. A plurality of capacitors are selectively switched into the circuitry such that the gain of each operational amplifier is accordingly varied.

A comparator connected to the output of the operational amplifier network compares the output signal level with a reference signal level and generates an instruction signal to a flip-flop circuit. Thus, no rectification of the output signal typically used to generate the instruction signal occurs. The flip-flop circuit provides digital control signals to a counter. The counter increments or decrements depending on the control signal provided by the flip-flop circuit. The digital output signal of the counter is coupled to the plurality of capacitors which determine the overall gain of the operational amplifier network. The digital bit signals of the counter, depending on whether high or low, selectively switch the appropriate capacitors into operation to vary the gain of each operational amplifiers stage.

Thus capacitors, which are the most accurate passive device in MOS technology, are employed to determine the gain of the amplifer stages instead of prior art resistive components. This results in stable, accurate, and low distortion operation. The design of the present invention is such that operational amplifiers designed in accordance herewith do not require high gain or low offset. This allows the use of operational amplifiers realizable in MOS technology. Also, digitally controlled attack and release times realizable in the present invention require no external timing components, thereby allowing for a single integrated circuit implementation of the complete AGC circuit. Thus, a simple, highly accurate AGC circuit in a single self-contained IC package utilizing MOS technology is provided.

Accordingly, one object of the subject invention is to provide an apparatus for adjusting the amplitude of an analog signal to a predetermined level.

Another object of the present invention is to provide an AGC circuit which provides closed-loop degenerative feedback for maintaining a peak amplitude reference level at the output of the amplifier stages.

Another object of the subject invention is to provide an AGC circuit wherein the release and attack time constants are determined soley by the reference frequency input and not dependent upon components internal to an IC chip.

It is yet a further object of the subject invention is to provide a stable and accurate AGC device utilizing the limited characteristics of operational amplifiers implementing MOS technology.

DESCRIPTION OF THE DRAWINGS

FIG. 1 is a schematic diagram of a prior art conventional AGC circuit.

FIG. 2 is a block diagram of one embodiment of the present invention.

DESCRIPTION OF A PREFERRED EMBODIMENT

Figure 3:
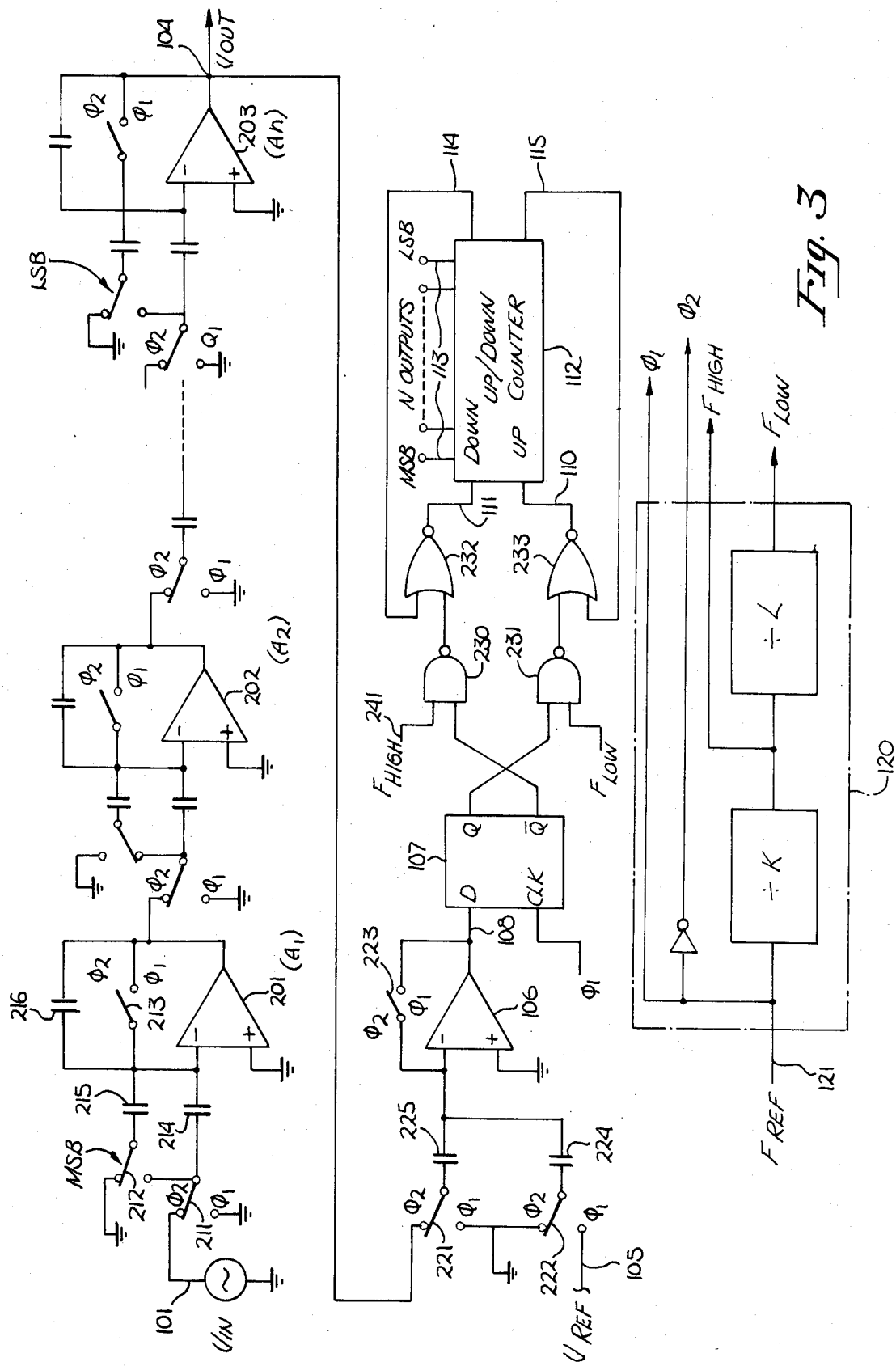
FIG. 3 shows a schematic diagram of a preferred embodiment of the present invention as represented by the block diagram of FIG. 2.

An integrated circuit metal oxide semiconductor (MOS) automatic gain control circuit utilizing a switched capacitor network is described. Referring to FIG. 2, a block diagram of a preferred embodiment of the present invention is shown. An input analog signal is applied at input 101 of the amplifier network 102. The amplifier network 102 consists of a plurality of auto-zeroed amplifier stages. The switched capacitor network 103 which is coupled to amplifier network 102 varies the gain of each amplifier stage by selectively switching appropriate capacitors into operation. The total gain of the amplifier network 102 varies accordingly. The output 104 of the amplifier network 102 is the amplified output signal and also provides an input to comparator 106.

The comparator compares output signal 104 to reference level 105 and generates an instruction signal 108 which is provided to the input of flip-flop circuit 107. The flip-flop circuit 107 provides the digital signal by providing either an upcount control signal 110 or downcount control signal 111 to up/down counter 112.

The up/down counter 112 decrements when the level of output signal 104 is above that of reference level 105. The counter 112 increments when the level of output signal 104 is below that of the reference level 105. A plurality of outputs 113 from the counter 112 control the switching of the capacitors included in switched capacitor network 103.

Frequency network 120 converts the reference frequency 121 and generates a multiplicity of clock frequency signals to the counter 112, a comparator 106, and flip-flop circuit 107 and to 102.

Referring now to FIG. 3, a schematic diagram of the preferred embodiment of the present invention represented in FIG. 2 is shown. The amplifier network 102 consists of N stages of auto-zeroed operational amplifiers with numerals 201, 202, and 203 representing amplifiers $A_1$, $A_2$ through $A_n$, respectively. It should thus be appreciated that the present invention may utilize any number of amplifier stages for a desired range of amplification. Since each such amplifier stage is functionally similar, the following description refers specifically to first amplifier stage ($A_1$) 201 which is typical of all subsequent amplifier stages $A_2$ through $A_n$. The switched capacitor network 103 consists of capacitors coupled to the circuitry of each amplificatier stage of the amplifier network 102. Capacitors 214, 215 and 216 represent the switched capacitors relative to amplifier stage 201.

During one-half cycle of the reference frequency ($\phi_1$) of $F_{ref}$ 121, amplifier 201 is auto-zeroed by the closure of switch 213 and the ground connection of switch 211. During the next half cycle of the reference frequency 121 ($\phi_2$), input signal 101 appears at the input of the capacitor 214, and switch 213 opens to place capacitor 216 into the feedback loop of amplifier 201. The binary status of the MSB of counter 112 controls the position of switch 212. When switch 212 is switched to ground, capacitor 215 is placed out of the gain loop and the gain of the amplifier calculates to:

$$(C214/C216)$$

When switch 212 is switched in parallel connection to capacitor 214, the gain of the amplifier calculates to:

$$(C214+C215)/C216$$

For example, by selecting the value of capacitor 214 to be of the same value as capacitor 216, and by selecting the value of capacitor 215 to be nine times the value of capacitor 216, the amplifier gain may shift between two gain values of 0 db and 20 db by the positioning of switch 212.

The choice of capacitor values selected determines the gain characteristics of the amplifier. Further, each amplifier stage may have different gain values. For example, utilizing N stages, the first stage may have a gain of 0 or X db; the second stage may have a gain of 0 or $\frac{1}{2}$ X db, and the nth stage may have a gain of 0 or $\frac{1}{2^n}$ X db. Hence, with N stages, each controlled by a digital output signal bit 113 of counter 112 the MSB control the position of switch 212, the next most significant bit controls the next amplifier stage 202 and the LSB controls the last amplifier stage 203 ($A_n$).

During the $\phi_1$ cycle of the reference frequency 121, switch 223 closes, switch 222 applies reference level 105 to input of capacitor 224, and switch 221 couples ground potential on input of capacitor 225. During the $\phi_1$ cycle, comparator 106 is auto-referenced to the reference level 105. During the $\phi_2$ cycle of the reference frequency 121, switch 223 opens, switch 222 places a ground potential on the input of capacitor 224, and switch 221 places the output signal 104 on the input of capacitor 225 wherein the output signal 104 is compared to the reference level 105. When the output signal 104 exceeds the reference level 105, the comparator 106 changes states and provides an instruction signal to flip-flop 107. Flip-flop 107, in conjunction with the NAND gates 230 and 231, and NOR gates 232 and 233 provide the digital control signals for incrementing or decrementing the counter.

When the output signal 104 increases above the reference level 105, the counter 112 decrements. Otherwise, the counter will increment. The counter digital output signal bits 113 control the position of the switches that place capacitors (e.g. 212) into the circuit of the amplifier stages of amplifier network 102. The command lines 114 and 115 from the counter 113 provide control to the logic circuit preventing the counter 113 from overflow when output signal bits 113 reach a state of all high (ones) or all low (zeros).

The frequency network 120 accepts the reference frequency signal 121 and provides all of the clock signals necessary for the operation of the present invention. Decrement frequency F-high 241 is higher in frequency than F-low 242 by a factor of L. F-high 241 determines the attack time while F-low 242 determines the release time of the AGC response. The attack time must be faster than the release time for the AGC circuit to operate properly in maintaining an average amplitude level.

Figure 4:
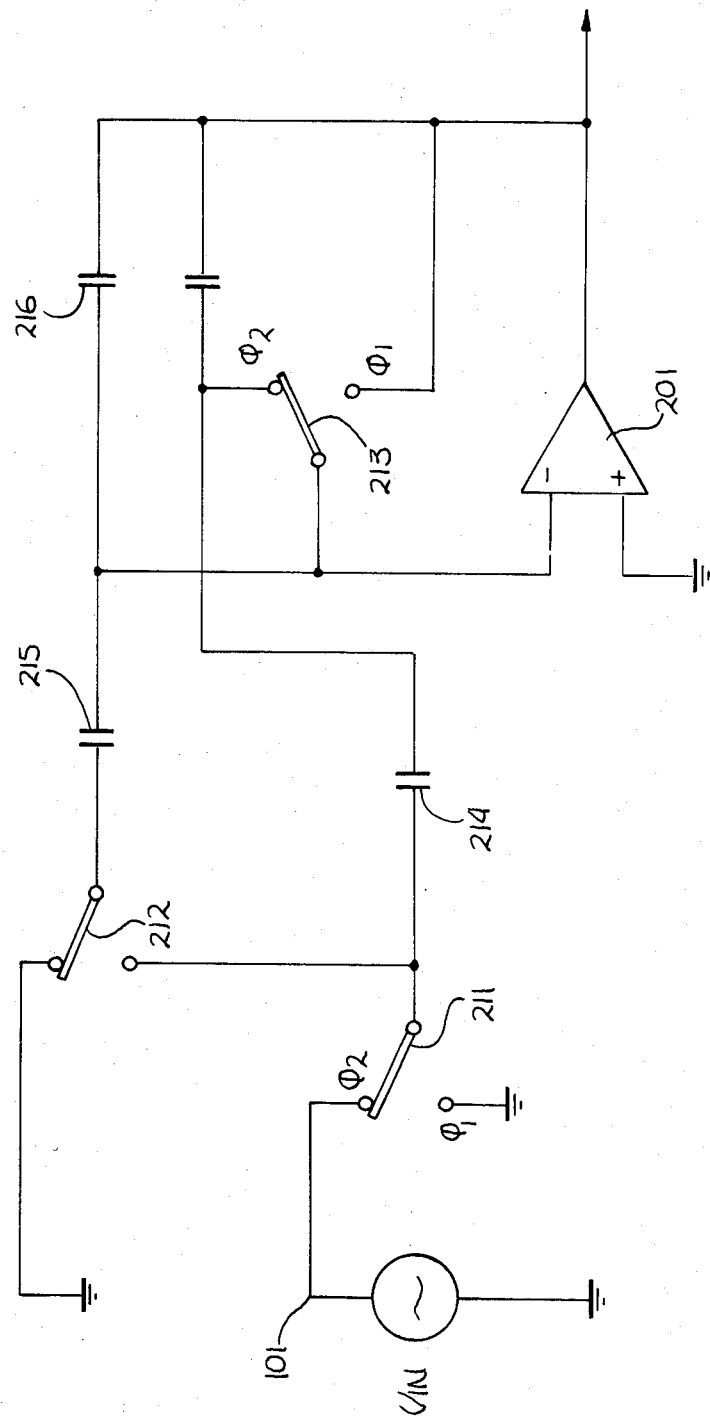
FIG. 4 shows a schematic diagram of an alternative embodiment of a gain stage of the present invention.

Referring now to FIG. 4, an alternative embodiment of the present invention is shown wherein the amplifier network 102 utilizes at least one high-pass gain stage. The scheme of FIG. 4 eliminates the undesirable accumulated dc offset voltage present at the input of such stage.

Figure 5:
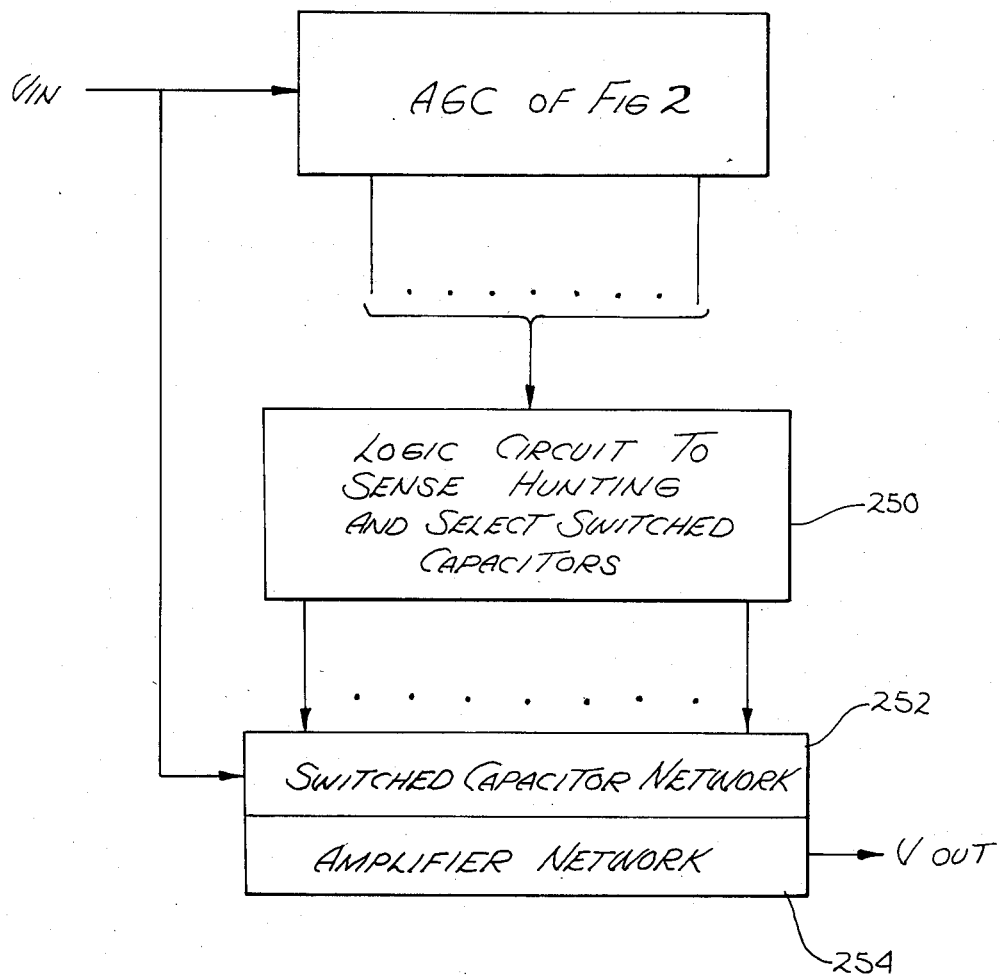
FIG. 5 shows a block diagram of an alternative embodiment of the present invention that eliminates hunting inherent in the embodiment of FIG. 2.

FIG. 5 illustrates yet another alternative embodiment of the present invention which utilizes an extra logic to sense 'hunting'; that is, the condition in which a device attempts to reach equilibrium by oscillating back and forth between two adjacent counts (or corresponding gains). Since a true equilibrium can never be reached in this type of circuit in which the feedback is digitally closed, the device will continue to hunt perpetually. Because the gain adjustments occur in steps in the embodiment shown in FIG. 3, the AGC circuit tends to hunt between two adjacent gain settings.

The embodiment illustrated in FIG. 5 alleviates this hunting entirely. An addition of a logic circuit 250 and the networks 252 and 254, replicating 102 and 103 are provided. The logic circuit senses the hunting and precludes further hunting by locking in the nearest gain adjustment step to the replica circuit. The logic sensing circuit as disclosed may be implemented by methods well known to those of ordinary skill in the art.

It will further be evident to those of ordinary skill in the art that above embodiments may be implemented alone or in combination to achieve the objects of the present invention and that changes and variations may be made without departing from its spirit and scope.

We claim:

1. An apparatus for adjusting the amplitude of an electrical signal to a predetermined level comprising:
   an input means for receiving an input analog signal;
   an output signal means;
   an amplifier network, including a plurality of cascaded sequentially coupled amplifier stages, said input signal means coupled to a first stage of said amplifier network, and a last stage coupled to said output means;
   a plurality of capacitors coupled to each said operational amplifier stage for determining the gain of each said operational amplifier stage;
   first switching means for selectively coupling said capacitors to said amplifier network for selectively establishing the gain of said network;
   a reference voltage source;
   a reference frequency means, including a plurality of clocking signals;
   a comparator comprising a single operational amplifier coupled to a voltage level of said output signal means and to a voltage level of said reference voltage source, for providing a comparator output signal representative of the comparison of said output signal from said output signal and said reference voltage;
   digital conversion means, including a flip-flop and logic circuit means, said digital conversion means converting said comparator output signal from said comparator to a digital signal at a frequency rate determined by said reference frequency source;
   and a counter, coupled to receive said digital signal from said digital conversion means for selectively providing control signals to said first switching means at a frequency determined by said reference frequency source.

2. The apparatus as defined in claim 1, further comprising a second switch means, said second switch means including selective switches for auto-zeroing said amplifier network and said comparator.

3. The apparatus as defined by claim 2, wherein said reference frequency source further includes a first clocking signal means for auto-zeroing said amplifier network and said comparator during a first half-period of said first clocking signal and a second half-period of said first clocking signal during which said signal is inputted to said amplifier network.

4. The apparatus as defined by claim 3, wherein said reference frequency means further includes a second clocking signal for determining an AGC response attack time, said attack time having a time period substantially from when said apparatus senses a voltage level at said output means exceeding in amplitude the voltage level of said reference voltage source until said voltage level at said output means substantially returns to a steady state.

5. The apparatus as defined by claim 4, wherein said reference frequency means further includes a third clocking signal for determining an AGC response release time, said release time having a time period from when said apparatus senses a voltage level at said output means not exceeding in amplitude a voltage level of said reference voltage source, until the voltage level at said output means substantially returns to a steady state.

6. The apparatus as claimed in claim 5, wherein the clock frequency of said second clocking signal exceeds that of said third clocking signal.

7. The apparatus as defined by claim 6, wherein said control signal of said counter further provides a digital signal for controlling the state of the switches of first said switching means.

8. The apparatus as defined by claim 7, wherein said counter decrements when a voltage level is sensed at said output means which is greater in amplitude than a voltage level of said reference voltage source, and increments when said output means is smaller in amplitude than a voltage level of said reference voltage source.

9. The apparatus as defined by claim 8, wherein said apparatus is implemented in metal-oxide-semiconductor integrated circuit chip.

10. The apparatur as defined by claim 8, wherein said plurality of cascaded operational amplifier stages of said amplifier network comprise a plurality of coupled high pass amplifiers.

11. A metal-oxide-semiconductor switched capacitor AGC circuit comprising:
   an input means for receiving an input analog signal;
   an output means;
   an amplifier network, including a plurality of cascaded operational amplifier stages coupled together, said input means being coupled to a first stage of said amplifier network, and a last stage coupled to said output means;

a plurality of capacitors coupled to said operational amplifier stages for selectively determining the gain of each said stage of said amplifier network;

first switch means to selectively couple said capacitors to said amplifier network for selectively establishing the gain of said network;

a reference voltage source;

a reference frequency means, including a plurality of clocking signals;

a comparator coupled to compare a voltage level of said output means and voltage level of said reference voltage source for providing a comparator output signal representative of the comparison of said signal and said reference voltage, said comparator signal being in a first state when a voltage level of said output terminal exceeds a voltage level of said reference voltage source, and said comparator signal being in an opposite state when a voltage level of said output terminal does not exceed said voltage level of said reference voltage source;

second switch means for auto-zeroing said amplifier network and said comparator;

digital conversion means, including a flip-flop and a logic circuit means, said digital conversion means converting said comparator output signal from said comparator to a digital signal at a frequency determined by said reference frequency source;

a counter, said counter coupled to said first switch means and coupled to receive said digital signal from said digital conversion means, such that binary status of the digital signal output of said counter controls the state of the switches of said first switch means;

whereby selectively and operatively coupling said capacitors into said amplifier network correspondingly adjusts an amplitude of an analog input signal to a predetermined reference level.

12. The apparatus as defined by claim 11, wherein said reference frequency means further includes a first clocking signal for determining an AGC response attack time, said attack time having a time period from when said apparatus senses a voltage level at said output means until said voltage level at said output means substantially returns to a steady state.

13. The apparatus as defined by claim 12, wherein said reference frequency means further includes a second clocking signal for determining an AGC response release time, said release time having a time period from when said apparatus senses a voltage level at said output means not exceeding in amplitude a voltage level of said reference voltage source, until the voltage level at said output means substantially returns to a steady state.

14. The apparatus as claimed in claim 13, wherein the clock frequency of said first clocking signal exceeds that of said second clocking signal.

15. The apparatus as defined by claim 14, wherein said control signal of said counter further provides a digital signal for controlling the state of the switches of said first switching means.

16. The apparatus as defined by claim 15, wherein said counter decrements when a voltage level is sensed at said output means which is greater in amplitude than a voltage level of said reference voltage source, and increments when said output means is smaller in amplitude than a voltage level of said reference voltage source.

17. The device as defined by claim 16, wherein said plurality of cascaded operational amplifier stages of said amplifier network includes a plurality of high pass amplifiers.

* * * * *